(12) United States Patent
Glasko et al.

(10) Patent No.: US 10,734,270 B2
(45) Date of Patent: Aug. 4, 2020

(54) VACUUM CHUCK WITH POLYMERIC EMBOSSMENTS

(71) Applicant: Entegris, Inc., Billerica, MA (US)

(72) Inventors: John Glasko, North Andover, MA (US); Richard A. Cooke, Framingham, MA (US); I-Kuan Lin, Lexington, MA (US)

(73) Assignee: ENTEGRIS, INC., Billerica, MA (US)

( * ) Notice: Subject to any disclaimer, the term of this patent is extended or adjusted under 35 U.S.C. 154(b) by 246 days.

(21) Appl. No.: 14/764,436

(22) PCT Filed: Feb. 11, 2014

(86) PCT No.: PCT/US2014/015735
§ 371 (c)(1),
(2) Date: Jul. 29, 2015

(87) PCT Pub. No.: WO2014/126896
PCT Pub. Date: Aug. 21, 2014

(65) Prior Publication Data
US 2015/0380294 A1 Dec. 31, 2015

Related U.S. Application Data

(60) Provisional application No. 61/834,748, filed on Jun. 13, 2013, provisional application No. 61/831,656, (Continued)

(51) Int. Cl.
*H01L 21/683* (2006.01)
*H01L 21/687* (2006.01)

(52) U.S. Cl.
CPC ...... *H01L 21/6838* (2013.01); *H01L 21/6875* (2013.01); *H01L 21/68735* (2013.01)

(58) Field of Classification Search
CPC ............ H01L 21/6838; H01L 21/6875; H01L 21/68735
See application file for complete search history.

(56) References Cited

U.S. PATENT DOCUMENTS 4,391,511 A 7/1983 Akiyama et al.
4,882,245 A 11/1989 Gelorme et al.
(Continued)

FOREIGN PATENT DOCUMENTS

JP H04-324658 A 11/1992
JP H05-205997 A 8/1993
(Continued)

OTHER PUBLICATIONS

Notification of Transmittal of the International Search Report and the Written Opinion of the International Searching Authority, or the Declaration for International Application No. PCT/US2014/015735, "Vacuum Chuck with Polymeric Embossments"; dated Apr. 10, 2014.
(Continued)

*Primary Examiner* — Sunil K Singh
*Assistant Examiner* — Paul M Janeski
(74) *Attorney, Agent, or Firm* — Entegris, Inc.

(57) ABSTRACT

A vacuum chuck with polymeric embossments is disclosed. The polymeric embossments are formed on the surface of a base substrate and are lapped to a flatness such that a wafer substrate clamped by the vacuum chuck has a peak to valley flatness that is less than a peak to valley flatness across the base substrate. Lapping of the polymeric embossments accommodates for variations in the flatness of the base substrate so long as the embossments are tall enough to stand over the peak to valley height variations in the base substrate.

9 Claims, 15 Drawing Sheets

Related U.S. Application Data filed on Jun. 6, 2013, provisional application No. 61/764,170, filed on Feb. 13, 2013.

(56) References Cited

U.S. PATENT DOCUMENTS

| | | | |
|---|---|---|---|
| 6,117,246 | A | 9/2000 | Parkhe et al. |
| 6,217,655 | B1 | 4/2001 | Kumar et al. |
| 2004/0157420 | A1 | 8/2004 | Sheydayi |
| 2007/0128570 | A1* | 6/2007 | Goto .................... F27D 5/0037 432/253 |
| 2007/0222131 | A1 | 9/2007 | Fukumoto et al. |
| 2009/0060688 | A1 | 3/2009 | Asada |

FOREIGN PATENT DOCUMENTS

| | | |
|---|---|---|
| JP | H09-283605 A | 10/1997 |
| JP | H10-229115 A | 8/1998 |
| JP | H10-233433 A | 9/1998 |
| JP | 2000-286330 A | 10/2000 |
| JP | 2001-237303 A | 8/2001 |
| JP | 2006-319093 A | 11/2006 |
| JP | 2006305713 A | 11/2006 |
| JP | 2010-515258 A | 5/2010 |
| JP | 2011-504960 A | 2/2011 |
| JP | 2012-121120 A | 6/2012 |
| JP | 2012527125 A | 11/2012 |
| WO | WO 2004/027839 A2 | 4/2004 |
| WO | WO 2010/132640 A2 | 11/2010 |
| WO | WO 2011/084531 A2 | 7/2011 |
| WO | WO 2012/033922 A2 | 3/2012 |
| WO | WO 2012/166256 A1 | 12/2012 |
| WO | 2014/126896 A1 | 8/2014 |

OTHER PUBLICATIONS

Second Written Opinion of the International Preliminary Examining Authority for International Application No. PCT/US2014/015735, "Vacuum Chuck with Polymeric Embossments"; dated Jan. 21, 2015.

Nordström, M., et al., "Investigation of the bond strength between the photo-sensitive polymer SU-8 and gold", *Microelectronic Engineering*, 78-79 (2005) 152-157.

Reuter, D., et al., "Selective adhesive bonding with SU-8 for zero-level packaging", *Proc. of SPIE*, vol. 5650; 163-171.

International Preliminary Report on Patentability for International Application No. PCT/US2014/015735, "Vacuum Chuck with Polymeric Embossments"; dated May 5, 2015.

https://en.wikipedia.org/wiki/Direct_bonding.

* cited by examiner

VACUUM CHUCK WITH POLYMERIC EMBOSSMENTS

RELATED APPLICATIONS

This application is the U.S. National Stage of International Application No. PCT/US2014/015735, filed Feb. 11, 2014, which designates the U.S., published in English, and claims the of U.S. Provisional Application No. 61/764,170, filed on Feb. 13, 2013; claims the benefit of U.S. Provisional Application No. 61/831,656, filed on Jun. 6, 2013; and claims the benefit of U.S. Provisional Application No. 61/834,748, filed on Jun. 13, 2013. The entire teachings of the above applications are incorporated herein by reference.

BACKGROUND OF THE INVENTION

There is a continuing need to clamp various substrates, such as silicon wafers, gallium arsenide wafers and other substrates, using a vacuum chuck while maintaining a substantially flat substrate surface. A flat substrate surface is important in microelectronics fabrication processes such as wafer fusion bonding. In the case of wafers, a flat wafer surface allows proper alignment of wafer features so that aligned fusion wafer bonding for wafer-level packaging and 3D integration can occur with a second wafer. Variations in the height of embossments on a vacuum chuck surface can lead to irregular wafer surfaces for the clamped wafer which can then lead to misalignment during a wafer bonding process. To address these variations, lapping has been used to flatten the base substrate surface of the vacuum chuck that underlies the embossments. However, this has not adequately addressed the need for improved alignment as semiconductor device sizes continue to decrease.

SUMMARY OF THE INVENTION

In accordance with one version of the invention, there is provided a vacuum chuck with polymeric embossments. The polymeric embossments are formed on the surface of a base substrate and are lapped to a flatness such that a wafer substrate clamped by the vacuum chuck has a peak to valley flatness that is less than a peak to valley flatness across the base substrate. Lapping of the polymeric embossments accommodates for variations in the flatness of the base substrate so long as the embossments are tall enough to stand over the peak to valley height variations in the base substrate.

In one version according to the invention, there is provided a vacuum chuck. The vacuum chuck comprises a base substrate comprising a first peak to valley flatness; and at least one embossment structure comprising a polymer and being disposed above the base substrate, the at least one embossment structure extending to a height above portions of the vacuum chuck surrounding the at least one embossment structure to support a substrate upon the at least one embossment structure during vacuum chucking of the substrate. The height of the at least one embossment structure is such that a prime wafer clamped by the vacuum chuck against the at least one embossment structure has a second peak to valley flatness that is less than the first peak to valley flatness.

In further, related versions, the second peak to valley flatness may be a flatness as measured by interferometry with a peak to valley variation of 5 microns or less, such as 2.5 microns or less, more particularly such as 1.5 microns or less, across at least a portion of the prime wafer when the prime wafer is clamped by the vacuum chuck at a pressure delta of between 50 torr and 750 torr between the vacuum chuck and the backside of the prime wafer. The first peak to valley flatness may comprise a peak to valley flatness across the base substrate of 5 microns or less. The at least one embossment structure may comprise a polymer embossment, or a polymeric overcoat over the base substrate and an underlying embossment base, or one or more vertical embossment layers. A layer of the one or more vertical embossment layers may comprise a dielectric material layer. A layer of the one or more vertical embossment layers may comprise a conductive material layer. A layer of the one or more vertical embossment layers may be selected from the group consisting of: a polymeric material layer; and a compound material layer comprising a polymer. The polymeric material layer may comprise a material selected from the group consisting of: a conductive polymeric material and a photo-patternable polymeric material. The one or more vertical embossment layers may comprise a plurality of polymer material layers, each polymer material layer of the plurality comprising a polymer of a different hardness. The conductive polymeric material may comprise a material selected from the group consisting of: a blend of a carbon nanotube and a polymer; and a conductive nanoparticle doped polymer. The photo-patternable polymeric material may comprise a material selected from the group consisting of: a polyimide based photo-patternable polymer and a benzocyclobutene based photo-patternable polymer. The dielectric material layer may comprise a low stress dielectric material. The low stress dielectric material may comprise a material selected from the group consisting of: an amorphous dielectric material and a polycrystalline dielectric material. The dielectric material layer may comprise a material selected from the group consisting of: silicon carbide; silicon oxide; silicon nitride; silicon oxynitride; an alloy of silicon with at least one other element; non-stoichiometric silicon carbide; a rare earth oxide; a rare earth oxynitride; a rare earth carbide; alumina oxide; aluminum nitride; aluminum oxynitride; a transitional metal oxide; a transition metal carbide; a transition metal oxynitride.

In further related versions, the vacuum chuck may further comprise a gas seal, one or more lift pin holes and corresponding gas seals, and one or more vacuum holes. The at least one embossment structure may comprise a plurality of embossment structures arranged in a pattern selected from the group consisting of: a trigonal pattern; a circular pattern; a square pattern; a rectangular pattern; an oval-shaped pattern; a honeycomb structure pattern; a connecting circular structure pattern; a connecting oval structure pattern; and a connecting rectangular structure pattern. The at least one embossment structure may comprise at least one embossment structure with a shape selected from the group consisting of: round; oval; triangular; rectangular; square; hexagonal; pentagonal; octahedral. The at least one embossment structure may comprise a plurality of embossment structures that vary in shape and pattern over a plurality of different regions of a surface of the vacuum chuck. The at least one embossment structure may comprise at least one embossment structure comprising a three-dimensional shape selected from the group consisting of: ball-shaped; cylinder-shaped; spiral-shaped; hour-glass-shaped; balloon-shaped; wave-shaped; tapered; and corrugated. The vacuum chuck may further comprise at least one metal barrier layer on one or more surfaces of the base substrate.

In other related versions, the at least one embossment structure may comprise a polymer that has a Young's Modulus of between about 1.5 and 3.5 GPa, and a tensile strength of between about 70 and 120 MPa. The height of the at least one embossment structure may be such that a prime wafer clamped by the vacuum chuck against the at least one embossment structure has a surface opposite the at least one embossment structure that has at least one of the following: a peak to valley measurement on a surface of the prime wafer overlying and measured across lift pin holes of the vacuum chuck that is 1 micron, or less than 1 micron; a peak to valley measurement from an edge of the clamped prime wafer to a point in the center of lift pins of the vacuum chuck that is 0.7 microns, or less than 0.7 microns; a peak to valley measurement across the entire clamped prime wafer that is 1.5 microns or less than 1.5 microns. The shape of the vacuum chuck at its top surface may be partially or substantially convex; or may be substantially flat. The at least one embossment structure may comprise a plurality of embossment structures arranged in a trigonal pattern. The at least one embossment structure may comprise a polymer that has an adhesion-shear strength greater than 20 megapascals.

In another version according to the invention, there is provided a method of making a vacuum chuck. The method comprises lapping at least one embossment structure comprising a polymer and disposed above a base substrate of the vacuum chuck, the base substrate comprising a first peak to valley flatness, the at least one embossment structure extending to a height above portions of the vacuum chuck surrounding the at least one embossment structure to support a substrate upon the at least one embossment structure during vacuum chucking of the substrate. The lapping of the at least one embossment structure is to a flatness whereby a height of the at least one embossment structure is such that a prime wafer clamped by the vacuum chuck against the at least one embossment structure has a second peak to valley flatness that is less than the first peak to valley flatness.

In another version according to the invention, there is provided a method of refurbishing a vacuum chuck. The method comprises removing at least one pre-existing structure comprising a polymer from atop a surface of the vacuum chuck; forming a clean surface of the vacuum chuck, the clean surface comprising a first peak to valley flatness; and forming at least one new embossment structure comprising a polymer atop the clean surface of the vacuum chuck, the at least one new embossment structure extending to a height above portions of the vacuum chuck surrounding the at least one new embossment structure to support a substrate upon the at least one new embossment structure during vacuum chucking of the substrate. The height of the at least one new embossment structure is such that a prime wafer clamped by the vacuum chuck against the at least one new embossment structure has a second peak to valley flatness that is less than the first peak to valley flatness.

In a further related version, an adhesion shear strength of the at least one new embossment structure with the clean surface of the vacuum chuck may be greater than 20 megapascals.

In another version according to the invention, there is provided a vacuum chuck comprising a base substrate comprising a first surface profile; and at least one embossment structure comprising a polymer and being disposed above the base substrate, the at least one embossment structure extending to a height above portions of the vacuum chuck surrounding the at least one embossment structure to support a substrate upon the at least one embossment structure during vacuum chucking of the substrate. The surface profile of the at least one embossment structure is such that a prime wafer clamped by the vacuum chuck against the at least one embossment structure has a predetermined target surface profile different from the first surface profile.

In further, related versions, the predetermined target surface profile may be substantially concave or substantially convex.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore non-limiting, embodiments illustrated in the drawings, wherein identical reference numerals designate the same components. Note that the features illustrated in the drawings are not necessarily drawn to scale.

DETAILED DESCRIPTION OF THE INVENTION

Figure 1:
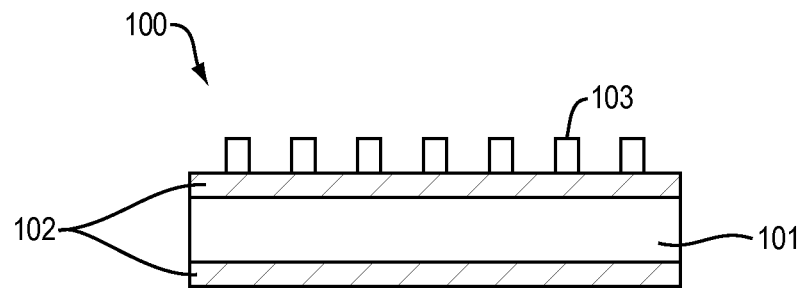
FIG. 1 is a schematic diagram of a vacuum chuck in accordance with a version of the invention.

While various compositions and methods are described, it is to be understood that this invention is not limited to the particular molecules, compositions, designs, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the"

include plural reference unless the context clearly dictates otherwise. Thus, for example, reference to an "embossment" is a reference to one or more embossments and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of embodiments of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having similar function or result). In some embodiments the term "about" refers to ±10% of the stated value, in other embodiments the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed or closed member groups.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The terms "bump" and "embossment" can be used interchangeably in the disclosure and claims.

FIG. 1 is a schematic diagram of a vacuum chuck 100 in accordance with a version of the invention. In accordance with one version of the invention, the problem of improving the flatness of a substrate clamped by a vacuum chuck is solved by a vacuum chuck that includes a base substrate 101 of high elastic modulus ceramic (such as alumina, silicon carbide, silicon nitride, and the like) or some other high stiffness alloy (for example steel), which may have a silicon carbide or other high purity metal barrier material 102 on a top, and optionally bottom, surface of the chuck base substrate 101. Polymeric embossments 103 are positioned on top of the base substrate 101 or on top of the metal barrier layer material 102 that overlies the base substrate. The polymer embossments 103 have a height such that the tops of the polymeric embossments 103 define a surface that can be characterized by a prime silicon wafer clamped by the vacuum chuck, the clamped prime silicon wafer has, for example, a flatness as measured by interferometry with a peak to valley variation of 5 microns or less (such as 2.5 microns or less) across portions of the prime silicon wafer when the prime silicon wafer is clamped at a pressure of between 50 torr and 750 torr (such as 150 torr) between the chuck and the backside of the prime silicon wafer.

Figure 2:
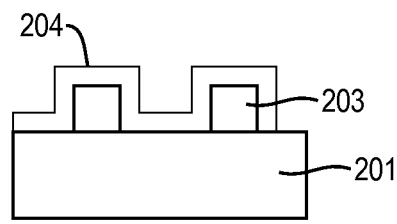
FIG. 2 is a schematic diagram of a vacuum chuck in accordance with another version of the invention, in which one or more embossment bases, disposed above a base substrate, are covered by a polymeric overcoat.

FIG. 2 is a schematic diagram of a vacuum chuck in accordance with another version of the invention, in which one or more embossment bases 203, disposed above a base substrate 201, are covered by a polymeric overcoat 204.

Figure 3:
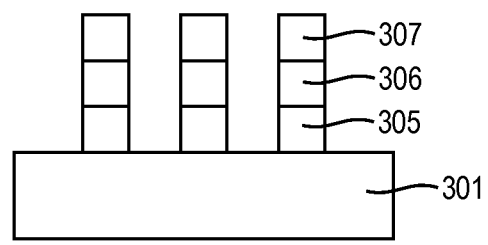
FIG. 3 is a schematic diagram of a vacuum chuck in accordance with a further version of the invention, in which at least one embossment structure includes one or more vertical layers.

FIG. 3 is a schematic diagram of a vacuum chuck in accordance with a further version of the invention, in which at least one embossment structure includes one or more vertical layers 305, 306, 307, disposed above a base substrate 301.

As used herein, an "embossment structure" may include any one of the embossment arrangements of FIGS. 1-3 and other embossment structures. For example, an embossment structure may include a polymer embossment as in FIG. 1, an embossment base covered by a polymeric overcoat, as in FIG. 2, or an embossment structure including one or more vertical layers, as in FIG. 3.

One or more layers of the one or more vertical embossment layers 305, 306, 307 may be selected from the group consisting of: a polymeric material layer; a conductive material layer (which may include a metal); a dielectric material layer (the dielectric may also be a polymeric material); a compound material layer comprising a polymer; and a layer including a combination of any of the foregoing. The dieletric material may comprise a dieletric constant of between about 1 and about 100. The polymeric material layer may comprise a conductive polymeric material or a photo-patternable polymeric material. The one or more vertical embossment layers may comprise a plurality of polymer material layers, each polymer material layer of the plurality comprising a polymer of a different hardness. As used herein, a "different hardness" signifies a material having a different hardness as measured by the Shore Durometer Hardness measure. For example, such materials may be found under Themal Properties, at the website http://www.plasticsintl.com/sortable_materials, downloaded from the internet on Feb. 10, 2014, the entire teachings of which are hereby incorporated herein by reference. The conductive polymeric material may comprise a material selected from the group consisting of: a blend of a carbon nanotube and a polymer; and a conductive nanoparticle doped polymer. For example, the conductive polymers may comprise a blend of a carbon nanotube and a polymer (such as Entegris TEGO™ polymer, sold by Entegris, Inc. of Billerica, Mass., U.S.A.); a carbon nanotube filled polycarbonate; and/or a conductive nanoparticle doped polymer. The photo-patternable polymeric material may comprise a material selected from the group consisting of: a polyimide based photo-patternable polymer and a benzocyclobutene based photo-patternable polymer. The dielectric material layer may comprise a low stress dielectric material. The low stress dielectric material may comprise a material selected from the group consisting of: an amorphous dielectric material and a polycrystalline dielectric material. The dielectric material layer may comprise a material selected from the group consisting of: silicon carbide; silicon oxide; silicon nitride; silicon oxynitride; an alloy of silicon with at least one other element; non-stoichiometric silicon carbide; a rare earth oxide; a rare earth oxynitride; a rare earth carbide; alumina oxide; aluminum nitride; aluminum oxynitride; a transitional metal oxide; a transition metal carbide; a transition metal oxynitride.

Another version of the invention is a method of making a vacuum chuck that includes the acts or steps of lapping polymeric embossments on a surface of the base substrate to a flatness whereby the tops of the polymeric embossments are characterized in that a prime silicon wafer clamped by the vacuum chuck has a peak to valley flatness that is less than a peak to valley flatness of the base substrate. For example, the flatness of the prime wafer as measured by interferometry may have a peak to valley variation of 5 microns or less, such as 2.5 microns or less, more particularly 1.5 microns or less, across portions of the substrate when the prime wafer is clamped by the vacuum chuck at a pressure of between 50 torr and 750 torr, such as 150 torr, between the chuck and the backside of the substrate. The embossments can be modified in a further step or act by reactive ion etching; the ion etching can clean surfaces of the polymeric embossments. The polymeric embossments can be formed on new base substrate or a new metal barrier layer, or the polymeric embossments can be formed on a vacuum chuck whose original polymeric embossments have been removed by plasma treatment or chemical treatment. The polymeric embossments formed on any of these surfaces have an adhesive shear strength with the underlying base substrate or metal barrier layer such that the polymeric embossments can be lapped to their final height.

Another version of the invention is a method of refurbishing a vacuum chuck with polymer embossments. The method comprises the acts or steps of removing polymer (includes embossment and or metal barrier layer) from atop the vacuum chuck base substrate or a metal barrier layer to make a clean base substrate or metal barrier layer surface, and subsequently forming polymeric embossments atop the clean surface of the base substrate or metal barrier layer. The polymeric embossments formed on any of these surfaces have an adhesive shear strength with the underlying base substrate or metal barrier layer such that the polymeric embossments can be lapped to their final height. Where the metal barrier layer is a polymer, the polymer including old embossments can be removed. Where the metal barrier layer is a material such as but not limited to SiC, the embossments can be removed from atop the metal barrier layer. The polymer may be removed for example but not limited to use of a reactive plasma, for example an oxygen containing plasma or fluorine containing plasma, or the polymer may be removed by solution based chemistry such as but not limited to ozonated water and ultra-violet light. A clean surface in versions of the invention is one where the adhesion shear strength of the embossment polymer material on the base substrate surface or overlying metal barrier layer surface permits subsequent lapping of the embossments to their final height, in some versions the adhesion shear strength of the embossments on the base substrate surface or overlying metal barrier layer surface is greater than 20 megapascals, in some versions the adhesion shear strength of the embossment polymer on the base substrate surface or overlying metal barrier layer surface is greater than 35 megapascals, and in still other versions of the invention the adhesion shear strength of the embossment polymer material on the base substrate surface or overlying metal barrier layer surface is greater than 70 megapascals.

The polymeric material that comprises the embossments can have a Young's Modulus of between about 1.5 and 3.5 GPa, a tensile strength of between about 70 and 120 MPa, and the polymeric embossments adhere to the underlying substrate and can be lapped. Non-limiting examples of polymeric materials for the embossments in versions of the invention include polyimide, and those polymers disclosed in U.S. Pat. No. 4,882,245 such as polymeric epoxy resin based SU-8.

In versions of the invention, the gas seals and embossments can be formed by spray coating or spin coating a photoresist, for example a polymeric epoxy resin like SU-8, onto the chuck body in conjunction with an appropriate lithographic technique. Optionally the polymer embossment can be formed using a polymer film which is applied or laminated to the base substrate or overlying metal barrier layer. The polymer film can be photolithographically patterned and developed to form the embossments. For example, photo-patternable polymer sheets that may be used include epoxy-based polymer sheets, polyimide-based polymer sheets and benzocyclobutene (BCB) polymer sheets in conjunction with an appropriate lamination and lithographic technique to form the gas seals and embossments. For example, epoxy-based polymer sheets such as the PerMx™ series, MX series and Riston® series polymer sheets sold by E.I. DuPont de Nemours and Company of Wilmington, Del., U.S.A., may be used, or TMMF S2000 and TMMR S2000 polymer sheets sold by Tokyo Ohko Kogyo Co., Limited may be used.

In some versions of making the vacuum chuck with polymer embossment, the base substrate or the overlying metal barrier layer is cleaned with a reactive plasma or other treatment such that when the polymer for the embossments is applied, patterned, and developed, the adhesion shear strength of the polymer with the underlying base substrate or underlying metal barrier layer is greater than 20 megapascals, in some versions the adhesion shear strength of the polymer with the underlying base substrate or metal barrier layer is greater than 35 megapascals, and in still some other versions the adhesion shear strength of the polymer with the underlying base substrate or metal barrier layer is greater than 70 megapascals. Optionally, adhesion promoters may be used to treat the base substrate or metal barrier layer surface prior to applying the polymer material. A non-limiting example of an adhesion promoter is HMDS (hexamethyldisilzane). Adhesion promoters create a bond between the polymeric photoresist and the bonding surface such as the base substrate or metal barrier layer.

In versions of the invention, suitable polymer materials for the embossments include those polymers that can be patterned and can be characterized as having an adhesion shear strength with the underlying metal barrier layer or the base substrate material which allows the patterned polymeric embossments to be lapped to their final height without tearing or damage to the patterned embossments from the underlying surface during the lapping process. In some versions of the invention, suitable polymer materials for the embossments include those polymers that can be patterned and can be characterized as having an adhesion shear strength with the underlying metal barrier layer or the base substrate material which allows the patterned polymeric embossments to be lapped with a diamond polishing pad and a fine polishing slurry under the chuck's own weight to their final height without tearing or damage to the patterned embossments from the underlying surface during the lapping process. Missing or damaged embossments will cause a wafer to sag excessively near the site of the missing or damaged embossment, which can result in poor alignment or misalignment of wafer structures during wafer to wafer bonding. The adhesion shear strength of the bond between the embossments and the underlying metal barrier layer or the base substrate material may be measured according to the ASTM standard D 1002 for adhesive bonds, the teachings of which ASTM standard are hereby incorporated herein by reference in their entirety.

In some versions of the invention the embossments are arranged in a substantially hexagonal pattern of a first density (embossments per unit area) across the top surface of the base substrate, while in other versions, embossments near chuck structures like lift pins and gas seals can have different densities of embossments or different patterns (non-hexagonal embossment pattern). In some versions of the invention, the arrangement of the embossments can follow an exclusion rule that may be applied in the vicinity of the seal rings (both the "lift pin hole" seal rings and the outer edge seal ring) wherein if a bump or embossment edge coincides with the edge of a seal ring, it is excluded from the final embossment pattern on the chuck. In other versions, the arrangement of the embossments does not follow an exclusion rule for bumps or embossments in the vicinity of the seal rings. In some versions, in the immediate vicinity of the lift pin holes and vacuum holes, the diameter of the bumps can be reduced and the inter-bump spacing can be reduced. In some versions the arrangement of the embossments can follow an exclusion rule that may be applied in the vicinity of the seal rings (both the "lift pin hole" seal rings and the outer edge seal ring) wherein if in a pattern of embossments is in a hexagonal pattern and an embossment edge coincides with the edge of a seal ring, that embossment is excluded from the final embossment pattern on the chuck. In other versions, the hexagonal arrangement of the embossments does not follow an exclusion rule for bumps or embossments in the vicinity of the seal rings. In addition, in the immediate vicinity of the lift pin holes and vacuum holes, the diameter of the embossments (bumps) can be reduced and the inter-embossment (inter-bump) spacing can be reduced.

In some versions of the invention, the polymeric embossments are arranged in a hexagonal pattern (except for where exclusion rules apply or where inter-embossment spacing or diameter is different) with an embossment located at or near the center of the base substrate. An embossment can be located at each of the vertices of the hexagons that make up the pattern. Depending on the thickness of the clamped substrate, the clamping force (determined by pressure), and the alignment requirements for the wafer to wafer bonding process, the center to center spacing, for example between two hexagon vertices, of the embossments and their diameter can be changed to give an acceptable substrate sag for a substrate to substrate bonding process. In a non-limiting example, embossments spaced 2.5 millimeter on center provides minimal sag of about 4 nanometers. Center to center spacing of polymer embossments on the chuck can be in the range of 0.5 mm to 7 mm, and can be chosen to minimize wafer sag and improve wafer to wafer bonding and alignment as needed.

In some versions of the invention the embossments can have a diameter of between 0.25 millimeters and 1 millimeter, and can be spaced apart from other embossments on the order of between 1 millimeter and 3 millimeters on center (center to center spacing). The height of the embossments can be chosen such that they stand above the peak to valley height variation of the base substrate (or layer such as SiC overlying the base) and can be lapped to a final height.

In versions of the invention, the embossments can have a height, after lapping, of between 5 microns and 100 microns as measured from the top surface of the underlying base substrate or metal barrier layer. In some versions of the vacuum chuck the embossments can have a height of between 5 microns and 50 microns. The height of the polymeric embossments can be an average value, and in some versions the height of the polymeric embossments falls within ±20 percent of an average height value. Uniform embossment heights can reduce wafer sag during clamping.

In accordance with one version of the invention, the polymeric embossments may have top surfaces whose height can be characterized as being able to clamp a vertically or horizontally oriented prime silicon wafer (prime 300 mm silicon wafers in use today are typically 750-800 m thick) so that variation in height of all or a part of the clamped wafer surface as measured by interferometry is 2.5 microns or less peak to valley, in some versions 1.5 microns or less peak to valley, in some versions 0.7 microns or less peak to valley, when the wafer is clamped by the vacuum chuck at a pressure of 150 torr as measured on the backside of the wafer. The vacuum chuck with polymeric embossments in versions of the invention can be further characterized by a three point gauge or by interferometry (FIG. 6), the variation in height across the vacuum chuck as measured by the gauge or interferometry is 2.5 microns or less.

In some versions of the invention, the vacuum chuck with polymer embossments can be characterized as providing a chucked prime wafer with a surface opposite the embossments that has one of or any combination of: a peak to valley measurement on the wafer surface overlying and measured across the lift pin holes that is 1 micron, or less than 1 micron; a peak to valley measurement from an edge of the chucked wafer to a point in the center of the lift pins that is 0.7 microns, or less than 0.7 microns; a peak to valley measurement across the entire chucked wafer that 1.5 microns or less than 1.5 microns. Smaller peak to valley values are advantageous for aligning features on wafers and other substrates used in wafer to wafer bonding or substrate to substrate bonding processes.

One version of the invention is a method of characterizing a chuck surface that includes mounting a test substrate (a wafer) on the embossments of the chuck by applying a clamping force, and measuring the peak to valley profile of the test substrate using interferometry.

In accordance with one version of the invention, the base substrate of the vacuum chuck can be a ceramic material, for example alumina, or other material like silicon carbide or silicon nitride. The base substrate can have a flatness (as measured by interferometry peak to valley) across its surface of 5 microns or less, in some versions the base substrate can have a flatness across its surface of 3.7 microns or less, and in still some other versions the base substrate can have a flatness across its surface of 2.5 microns or less. In yet still other versions, the base substrate can have a flatness of 1 micron or less across its surface. The base substrate can have a flatness (as measured by interferometry peak to valley) across its surface of between 3.7 microns to 0.5 microns, and in still some other versions the base substrate can have a flatness across its surface of between 2.5 microns to 0.5 microns. In yet still other versions the base substrate can have a flatness across its surface of between 1 micron and 0.5 micron. Flatter chuck surfaces allow better alignment of wafers during wafer bonding and higher manufacturing yields which is advantageous.

In some versions the base has a convex shape or substantially convex shape on its top facing surface. In other versions the base has a substantially flat shape on its top facing surface. In still other versions the base has a concave shape or substantially concave shape on its top facing surface.

Figure 6:
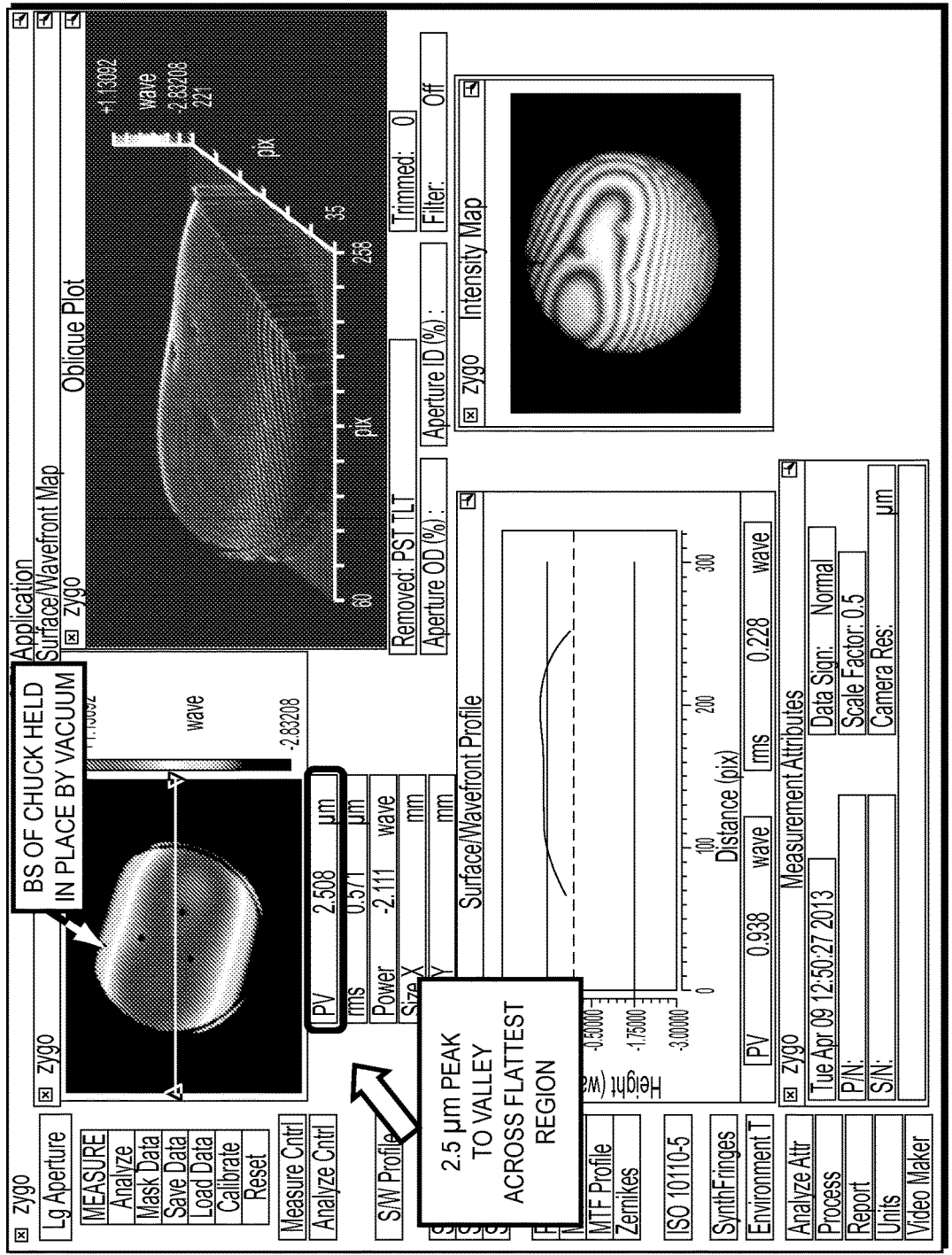
FIGS. 6-12 and 14-17 are interferograms obtained in experiments for vacuum chucks in accordance with a version of the invention.
Figure 14:
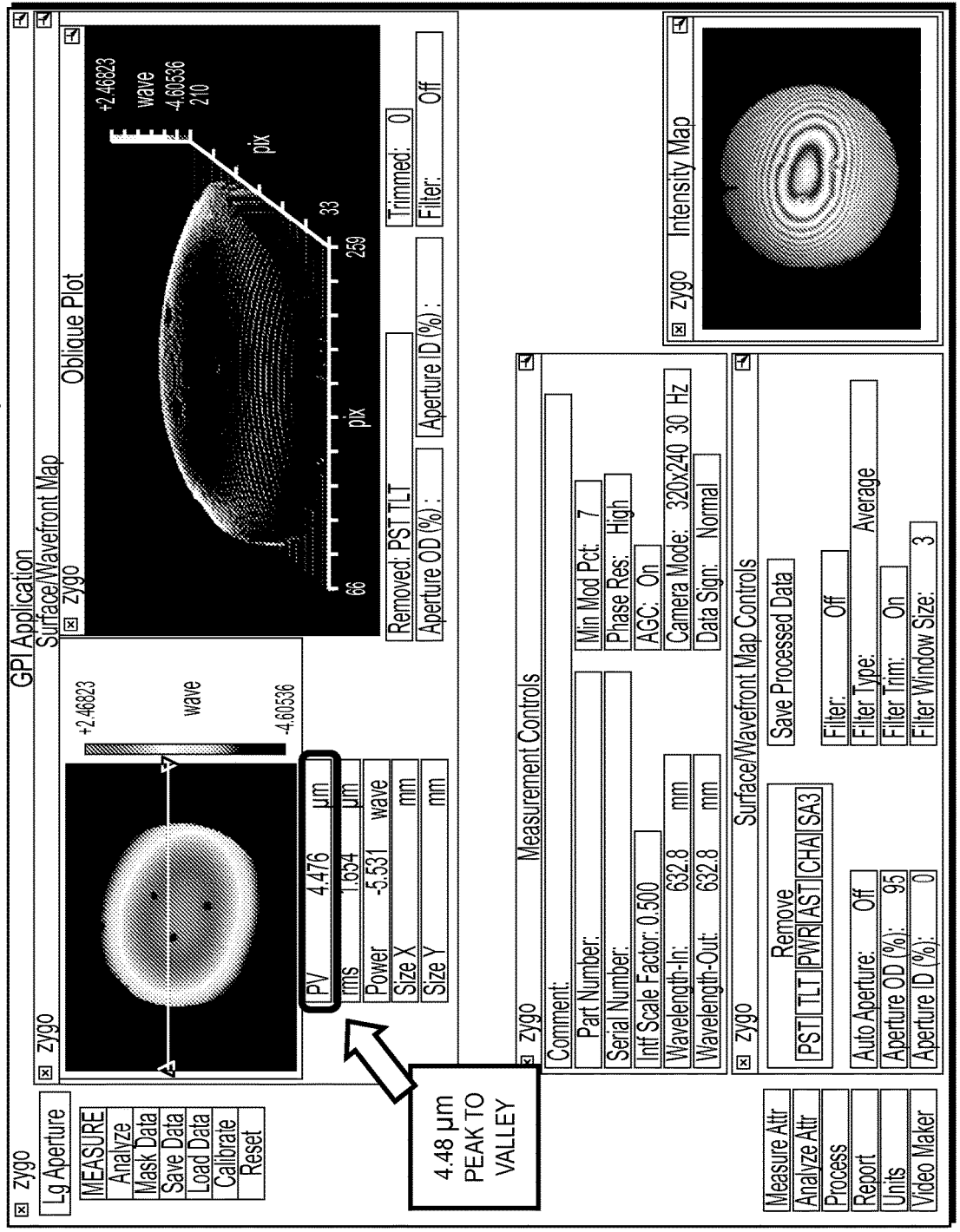

In accordance with one version of the invention, the vacuum chuck, which may include one or more metal barrier layers and polymeric embossments, can have a shape at its top surface that is partially or substantially convex. For example, the vacuum chuck shown in FIG. 6 is a non-limiting example of a vacuum chuck with a partially convex top surface, whereas the vacuum chuck top surface shown in FIG. 9 (characterized by the overlying clamped wafer) is a non-limiting example of a substantially symmetric dome shaped or substantially convex shaped vacuum chuck. FIG. 14 is an example of a base substrate with a coating of a metal barrier layer that has substantially dome shaped or substantially convex shaped.

In one version of the invention, the base substrate can include a metal barrier layer on one or more of its surfaces. This metal barrier layer prevents or slows the migration of metals and metal ions from the substrate base which may contaminate clamped substrates. Non-limiting examples of metal barrier layers include SiC, SiN, and certain polymeric epoxy resins like SU-8.

In versions of the invention, the base substrate which is used for the vacuum chuck can be between 5 millimeters and 25 millimeters thick, in some cases between 8 mm and 10 mm thick, and may be 20 mm to 25 mm for 300 mm to 450 mm chucks. A metal barrier layer, for example SiC, SiN, or other material can be applied to the top and or bottom surface of the base substrate. The thickness of the metal barrier layer is chosen to decrease metal contamination (thicker layers decrease migration) while also optimizing the shape of the base substrate. Stress between some metal barrier layers (for example SiC and SiN) and the substrate base can lead to warping of the metal barrier coated substrate base. Metal barrier layer coatings of between 0.1 microns and 5 microns in thickness (provides good surface coverage) can be used on any of the substrate base surfaces (top, bottom, sides) to prevent or inhibit metal migration from the substrate base and to balance stress and thereby control the shape of the metal barrier coated substrate base. By selecting the thickness of the metal barrier layers and/or lapping the metal barrier layer and chuck base composite, the shape of the metal barrier layer and chuck base composite can be modified and made convex, concave, or substantially flat. In some versions of the chuck, the top surface of the chuck has a convex shape or a dome shape. Without wishing to be bound by theory, it is thought that a slightly convex or dome shape on the top surface of the chuck (including lapped embossments) is advantageous to the wafer bonding processes because by keeping the clamped wafer slightly convex, when the bond pin bows the top side wafer (presents a convex surface to the clamped wafer) at the initiation of bonding, the lower wafer (flattened from its original convex shape) offsets the bond pin bow and the two wafers are in a more optimal configuration at the initiation of bonding and propagation of the bond wave.

Figure 4A:
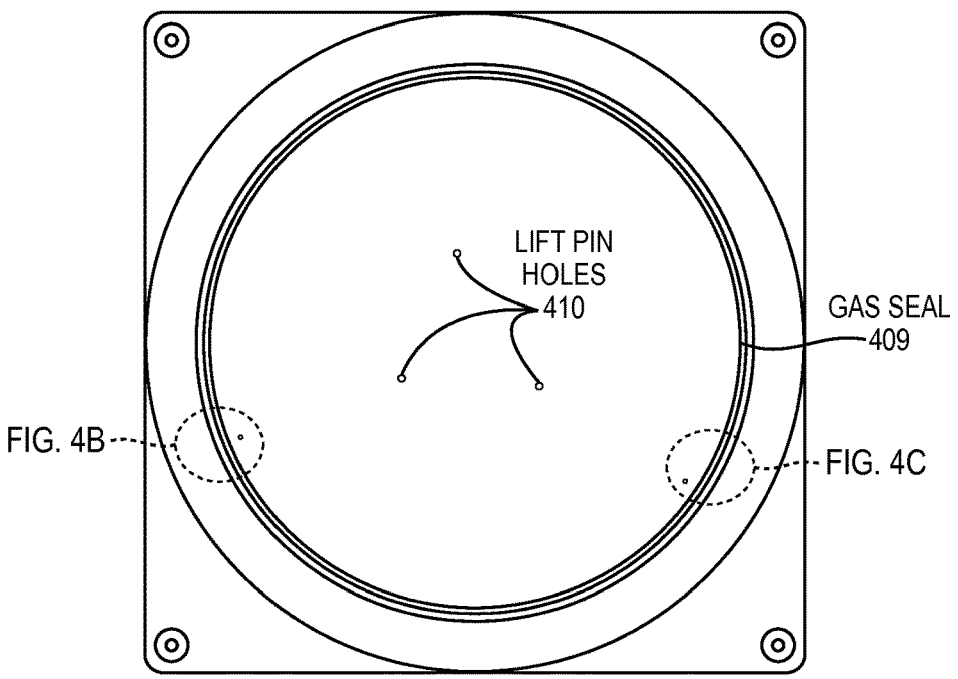
FIGS. 4A-4C are diagrams of a vacuum chuck in accordance with a version of the invention.
Figure 4B:
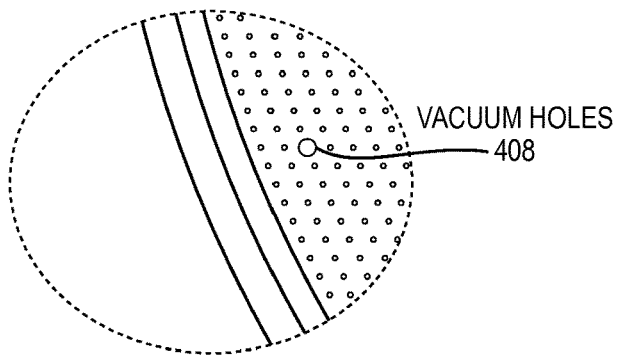
Figure 4C:
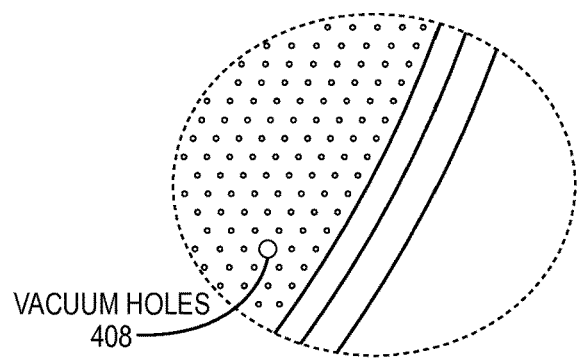

FIGS. 4A-4C are diagrams of a vacuum chuck in accordance with a version of the invention. The vacuum chuck includes one or more vacuum ports or holes 408 (see close-up views of FIGS. 4B and 4C) in the surface of the base substrate, a gas seal 409 (FIG. 4A) located along an outer edge of the base substrate, and one or more lift pin openings or holes 410 (FIG. 4A) with lift pin gas seals.

Figure 5:
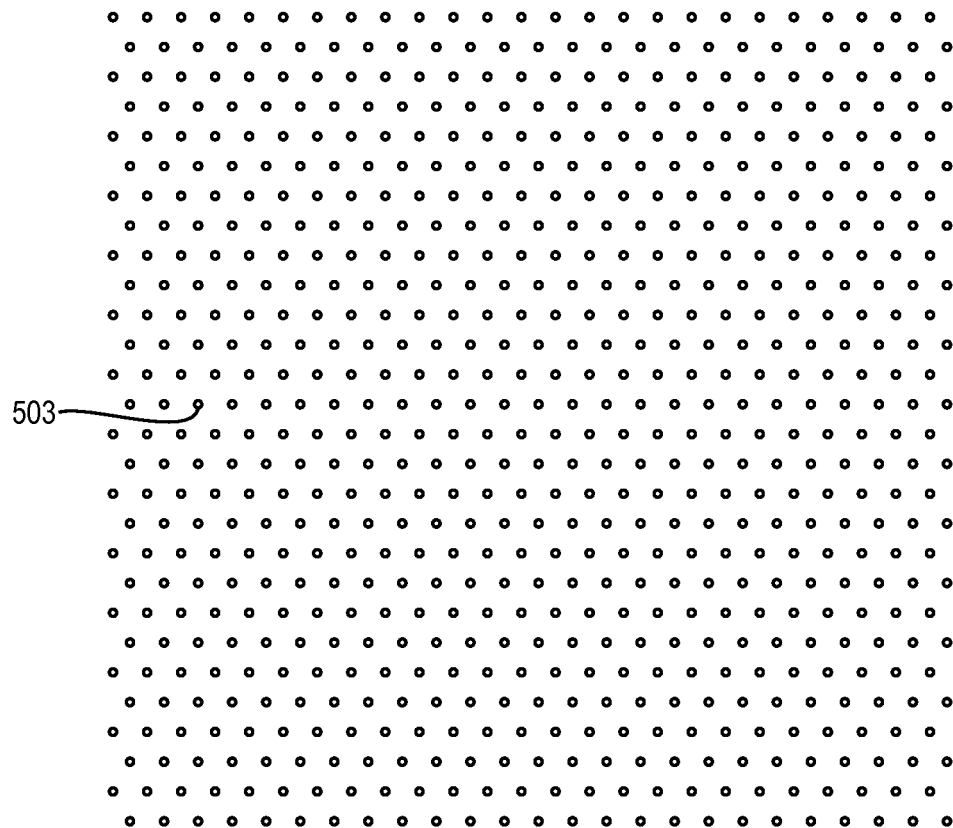
FIG. 5 is an illustration of a pattern of embossment structures on the surface of a vacuum chuck, in accordance with a version of the invention, in which the pattern is used to reduce the forces between a substrate and the embossment structures.

FIG. 5 is an illustration of a pattern of embossment structures 503 on the surface of a vacuum chuck, in accordance with a version of the invention, in which the pattern is used to reduce the forces between a substrate and the embossment structures 503. Patterns that equally distribute such forces may be used, for example trigonal or generally hexagonal patterns. It should be appreciated that, as used herein, a "trigonal" pattern is intended to mean a regularly repeating pattern of equilateral triangles of embossment structures, such that the embossment structures are substantially equally spaced apart. Such a pattern may also be viewed as being generally hexagonal in shape, with a central protrusion in the center of an array of six protrusions that form the vertices of a regular hexagon, and hence may also be referred to as "hexagonal" herein. The embossment structures may include (but not be limited to) at least some embossment structures arranged in one or more of the following patterns: a trigonal pattern; a circular pattern; a square pattern; a rectangular pattern; an oval-shaped pattern; a honeycomb structure pattern; a connecting circular structure pattern; a connecting oval structure pattern; and a connecting rectangular structure pattern. The at least one embossment structure may comprise at least one embossment structure with a shape selected from the group consisting of: round; oval; triangular; rectangular; square; hexagonal; pentagonal; octahedral. The at least one embossment structure may comprise a plurality of embossment structures that vary in shape and pattern over a plurality of different regions of a surface of the vacuum chuck. In addition, the at least one embossment structure may comprise at least one embossment structure comprising a three-dimensional shape selected from the group consisting of: ball-shaped; cylinder-shaped; spiral-shaped; hour-glass-shaped; balloon-shaped; wave-shaped; tapered; and corrugated. Such shapes may be used to adjust the elasticity of the embossment structure in the horizontal and/or vertical directions.

In one version, lapping of the embossments and chuck surfaces can be performed using a lapping plate with a lapping pad that contains an abrasive like diamond, boron nitride, and other known abrasives. A lubricating liquid is applied between the lapping pad and the surface of the chuck with the polymer embossments. The chuck and its embossments can be lapped under the chuck's own weight or with weights placed atop the chuck surface.

The circumferential gas seal and the lift pin gas seals can also be made of the polymer used for the polymeric embossments.

In accordance with versions of the invention, an advantage of the chuck as disclosed herein is that the flatness of the base substrate is not critical because so long as the embossments are tall enough to stand over the peak to valley height variations in the base substrate (5 microns or less as detailed above), the embossments can be lapped to provide a "flat" surface or an overall domed surface defined by the embossment tops. It is not obvious to use a polymer for the embossments and lap them because polymers are soft which makes lapping difficult, and lapping can result in tearing of embossments from the substrate surface thereby decreasing manufacturing yields.

Another advantage of chucks in accordance with a version of the invention is that after the chucks have been used, the embossments can be removed from the base substrate surface or the metal barrier layer by plasma treatment, for example but not limited to an oxygen containing plasma, and new embossments formed on the cleaned surface as described above. The ability to refurbish (strip off old polymeric embossments and apply new polymeric embossments) these vacuum chucks with polymeric embossments reduces costs (the base substrate can be reused) and is environmentally friendly because it reduces waste from discarded base substrates.

In another version according to the invention, embossment structures may have a surface profile that is tailored to produced a desired, predetermined target surface profile for the chucked wafer, which is different from the surface profile of the base substrate. For example, the target surface profile need not be flat, and could even be convex, concave, or another predetermined desired target profile.

EXPERIMENTAL

Example 1

This example uses interferometry to characterize the surface of a substrate wafer that was clamped vertically on the top surfaces of the polymer chuck embossments. The pressure in the space between the chuck and back side of the substrate wafer was 150 torr and resulted in a force that clamped the substrate on the polymeric embossments. A Zygo Interferometer was used to characterize: (A) the surface of the vacuum chuck embossments prior to lapping (FIG. 6), (B) the surface of a blank test prime 300 mm silicon wafer (surface opposite the embossments) that was clamped by the vacuum chuck with polymer embossments prior to lapping the embossments (FIG. 7 and FIG. 8), and (C) the surface of a blank test prime 300 mm silicon wafer (surface opposite lapped embossments) that was clamped by the vacuum chuck with embossments after the embossments had been lapped (FIG. 9).

A lithographic mask was used to pattern polymeric embossments comprising an epoxy based polymer on the top surface of the ceramic chuck. The chuck surface had been previously lapped to within about 2.5 microns flatness across the chuck surface. The polymeric embossments or bumps were lithographically formed and developed on the surface of this lapped ceramic chuck surface and were all 0.75 mm in diameter and spaced 2.5 mm apart (center to center) in a hexagonal pattern. The polymeric embossments included an epoxy based resin, also called SU 8 polymer, available from MicroChem Corporation of Newton, Mass., U.S.A. The arrangement of the embossments followed an exclusion rule that was applied in the vicinity of the seal rings (both the "lift pin hole" seal rings and the outer edge seal ring): if a bump edge coincided with the edge of a seal ring, it was excluded from the final embossment pattern on the chuck.

The Alumina substrate base, in this case, is of the order of 8 mm thick, had a top surface layer metal barrier SiC coating of between 2.5 microns and 3 microns in thickness, and a bottom coating of SiC that was about 1.5 microns thick. The epoxy based polymer embossments were between 35 microns and 45 microns tall prior to lapping. The silicon carbide provides a barrier to metals from the alumina base and the combination of thickness of silicon carbide on the top and bottom of the alumina base provides a slightly convex shape to the top facing surface of the chuck as shown in FIG. 6.

FIG. 6 shows the peak to valley measurement determined by interferometry across the chuck, which was 2.5 microns (no wafer, prior to lapping). The chuck has a partial convex shape across a portion of its surface as illustrated by the interferogram.

Figure 7:
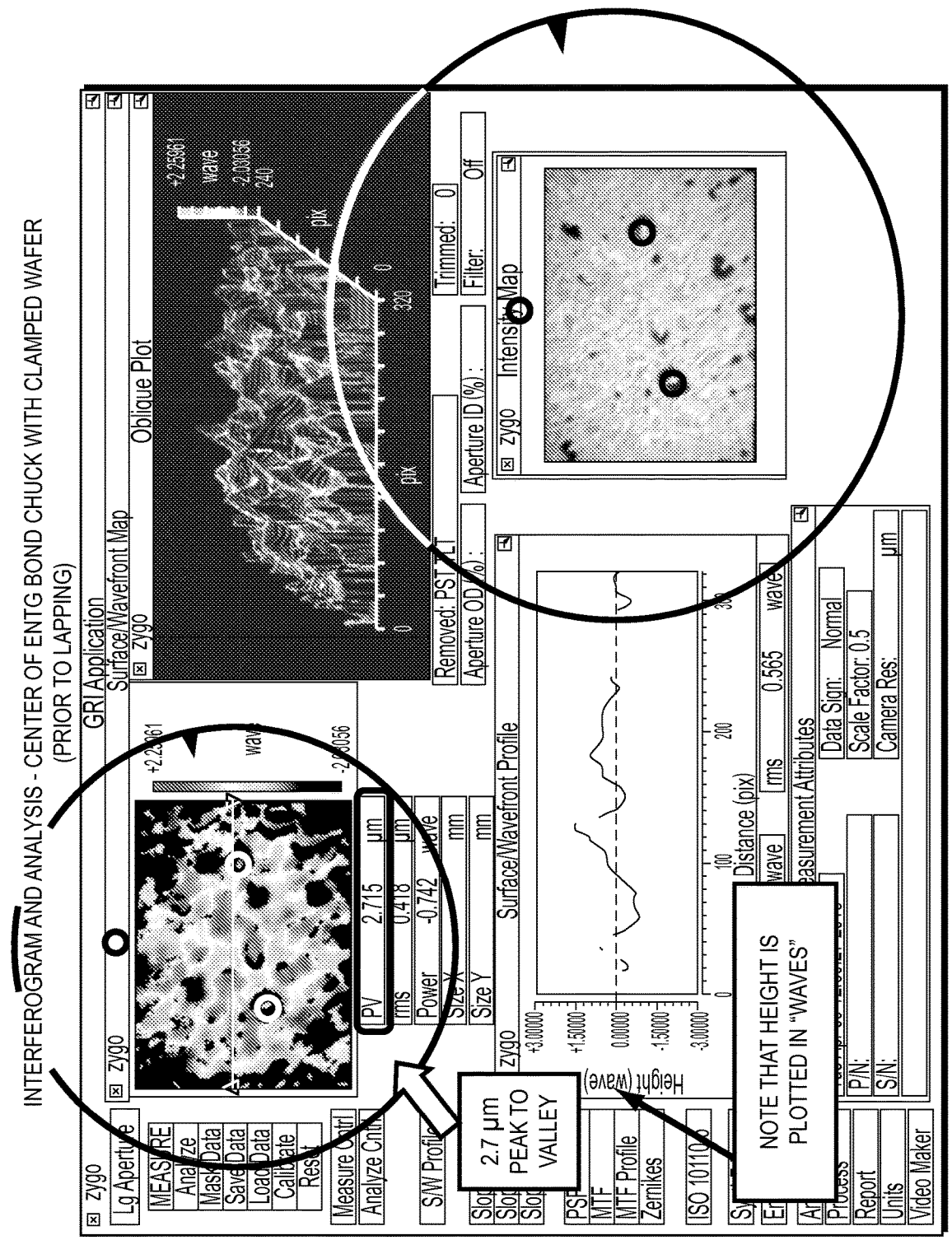

FIG. 7 shows the peak to valley measurement by interferometry across a clamped or held wafer (prior to lapping of the chuck polymeric embossments); the peak to valley height across this center portion of the wafer (center) is about 2.7 microns.

Figure 8:
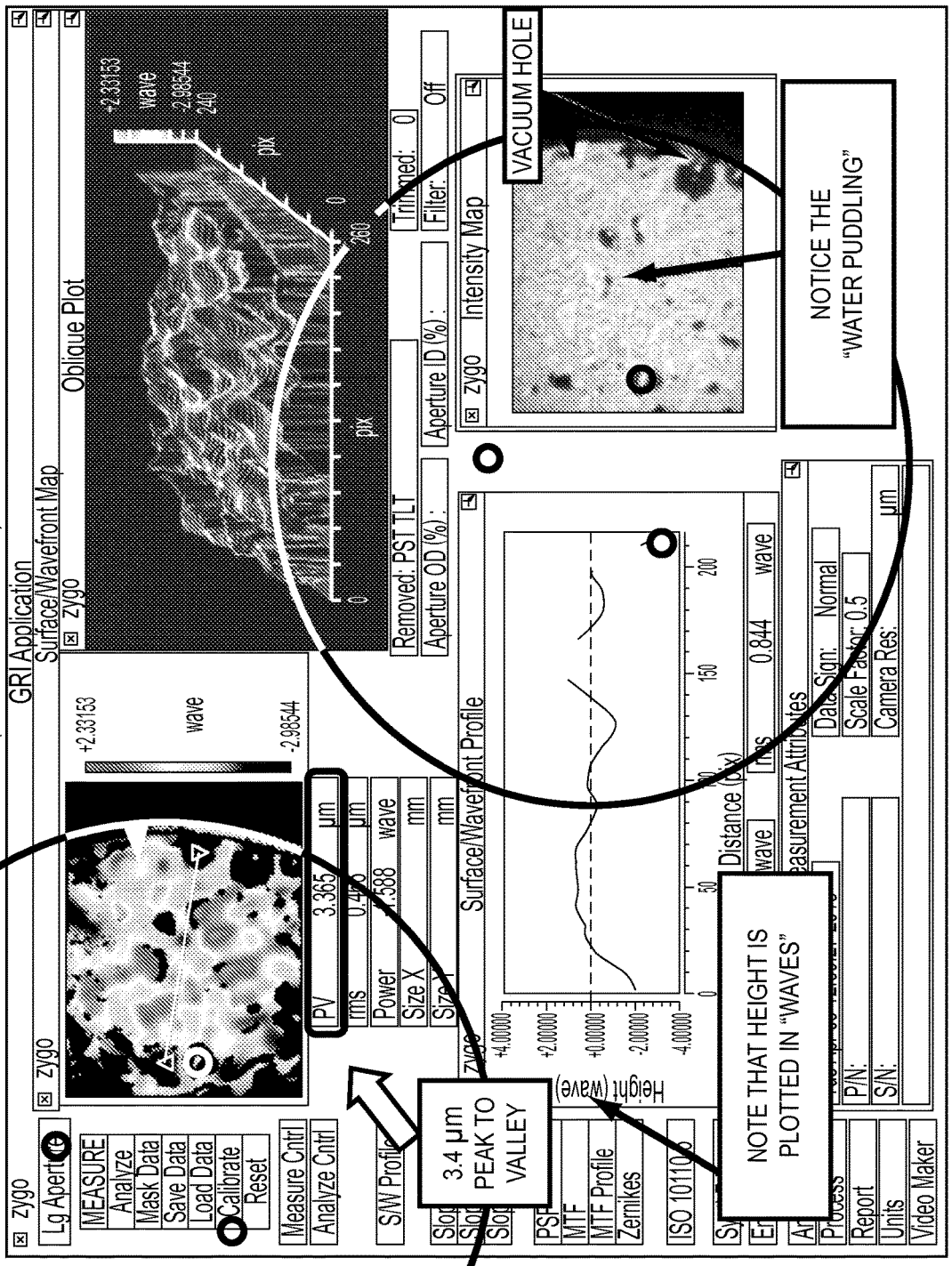
Figure 9:
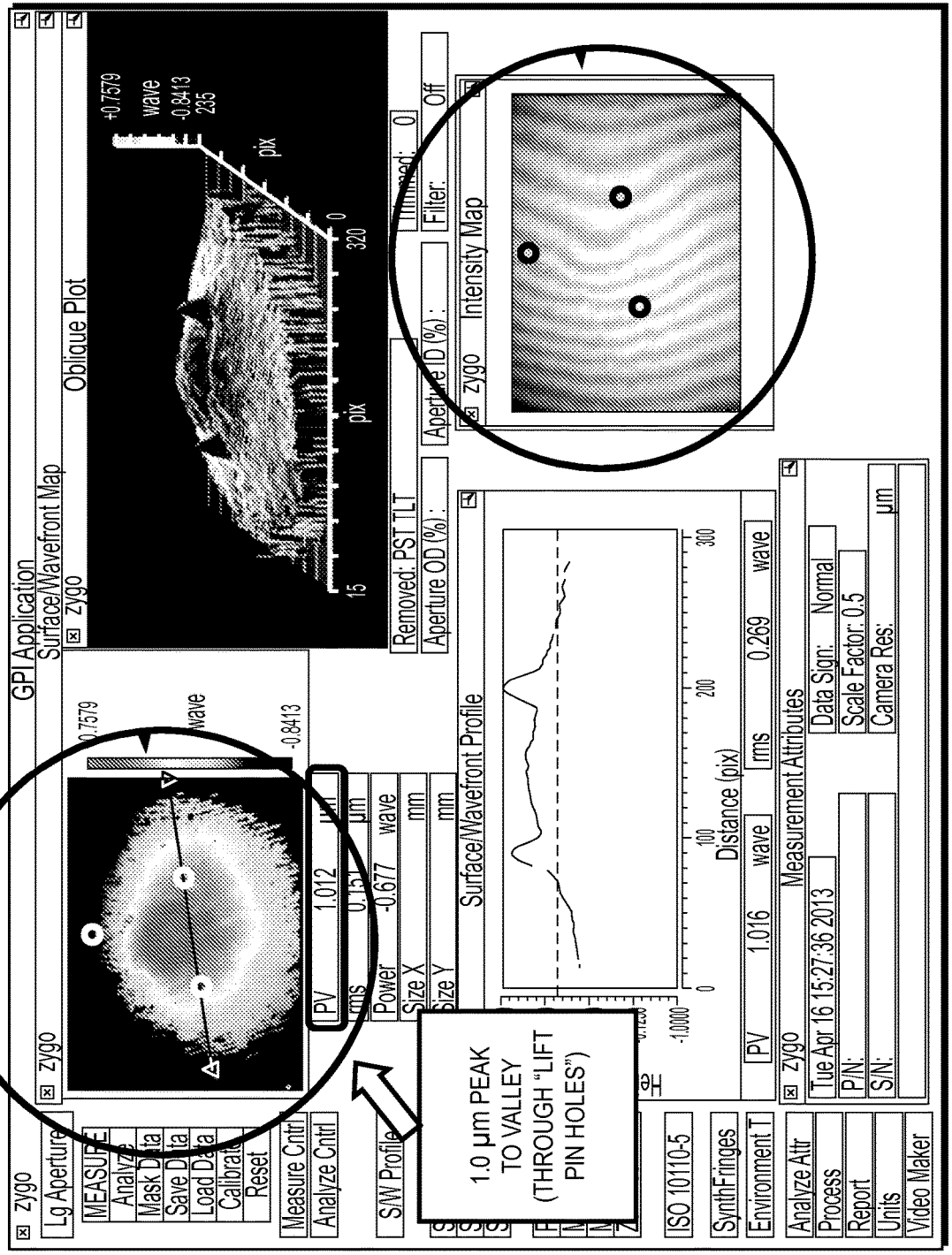

FIG. 8 shows the peak to valley measurement by interferometry across a clamped or held wafer (prior to lapping of the chuck polymeric embossments); the peak to valley height across this edge portion of the wafer is about 3.4 microns.

FIG. 9 shows the peak to valley measurement by interferometry across a clamped or held wafer after lapping the chuck polymeric embossments; the peak to valley height across this portion of the wafer through the lift pin holes is about 1 microns. This image illustrates a substantially convex or dome shaped clamped wafer that is a result of being clamped to a substantially convex or dome shaped vacuum chuck with polymeric embossments.

Figure 10:
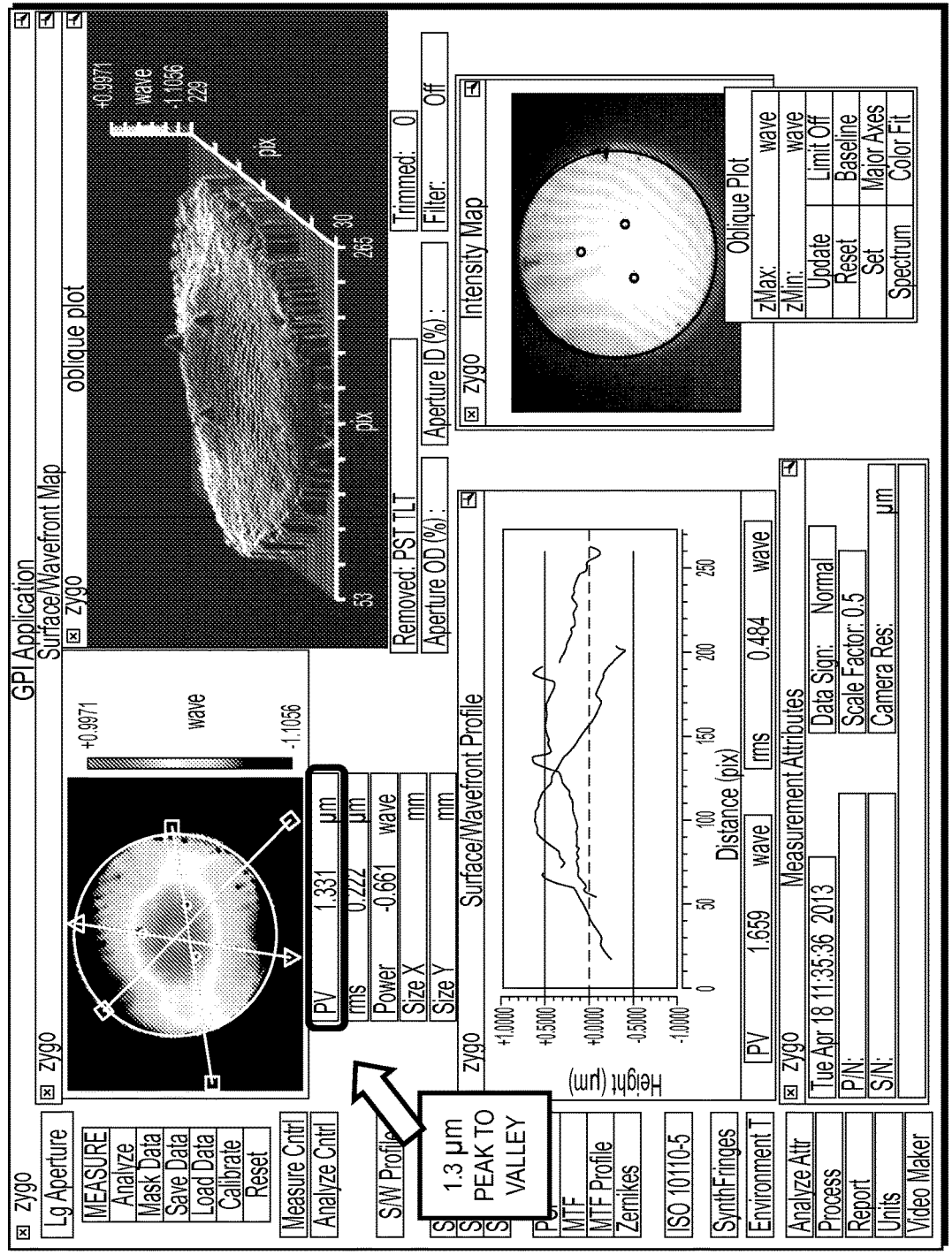

FIG. 10 shows the peak to valley measurement by interferometry across a clamped or held wafer after lapping the chuck polymeric embossments; the peak to valley height across the clamped wafer through the lift pin holes is about 1.3 microns.

Figure 11:
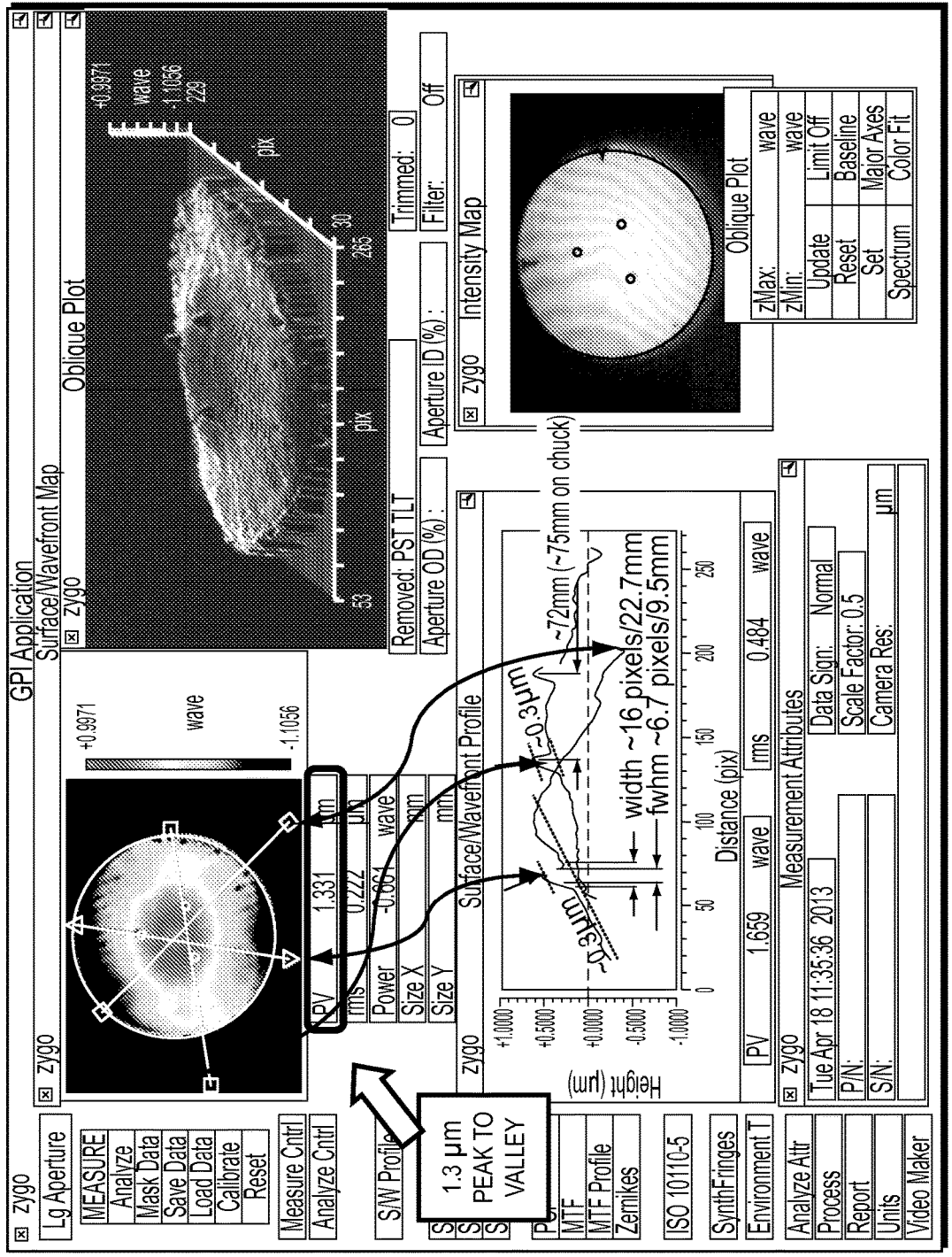

FIG. 11 is a close up examination of the interferogram in FIG. 10 and illustrates the clamped wafer surface in the region of the lift pins on the surface of the underlying vacuum chuck.

Figure 12:
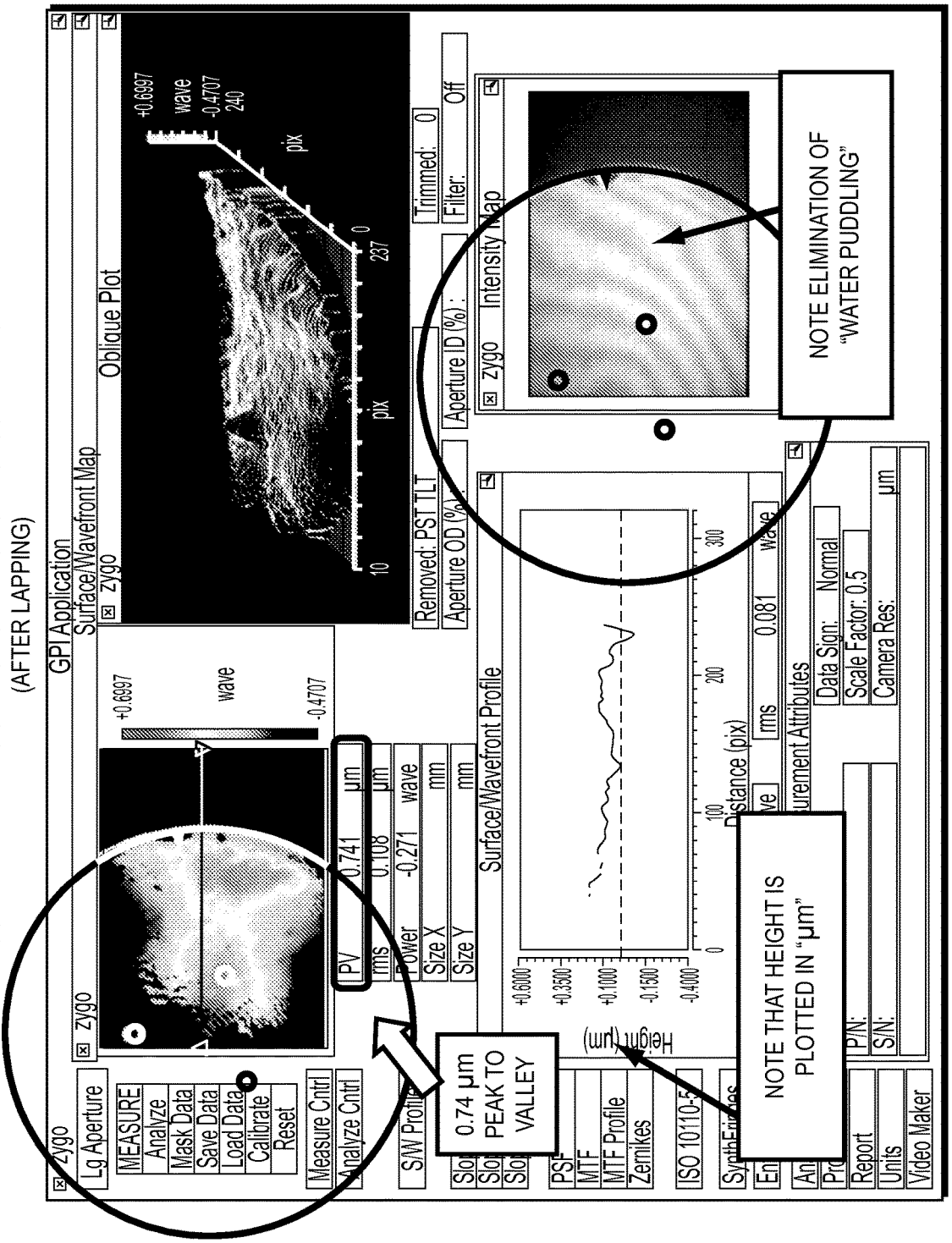

FIG. 12 shows the peak to valley measurement by interferometry across a clamped or held wafer after lapping the chuck polymeric embossments; the peak to valley height across this edge portion of the wafer from the center of the lift pin holes to the edge of the clamped wafer is about 0.7 microns.

The results of the interferometric measurements in this example clearly show that lapping of the epoxy based polymer embossments, independent of the flatness of the underlying chuck surface (2.5 micron peak to valley as shown in FIG. 6), improves the flatness of a wafer clamped by the vacuum chuck. The interferometric measurements show that prior to lapping the embossments, the clamped substrate wafer had a flatness with peak to valley measurement at various spots on the wafer surface of between 2.7 microns and 3.3 microns. Following lapping of the embossments, the peak to valley measurement at various spots on the wafer surface was 1 micron through the lift pin holes (FIG. 9), the peak to valley measurement was 0.7 microns near the edge of the substrate wafer to the center of the lift pins (FIG. 12), and the peak to valley measurement was 1.3 microns across the entire chuck (can be for example the substrate diameter or for example measured through two lift pins as shown in FIG. 10).

Example 2

In this example, no exclusion rule was applied to bumps or embossments in the vicinity of the seal rings. In addition, in the immediate vicinity of the lift pin holes and vacuum holes, the diameter of the bumps was reduced and the inter-bump spacing was reduced. The diameter of the "lift pin hole" seal rings was also reduced. In these regions, the bumps are 0.5 mm in diameter and are 1.92 mm apart, center to center while in other areas the bumps or embossments were 0.75 millimeter in diameter and spaced 2.5 millimeter (mm) apart (center to center) as in Example 1. The seal rings around the lift pin holes had an outer diameter (OD) of 11.15 mm and inner diameter (ID) of 7.65 mm.

Figure 13:
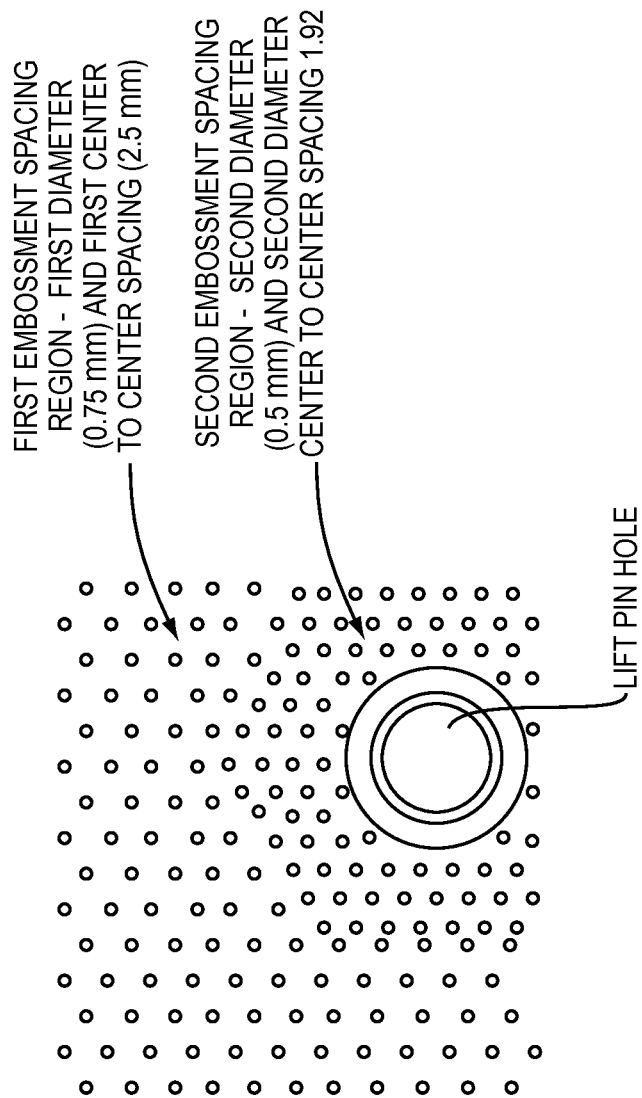
FIG. 13 is a diagram showing a portion of mask work illustrating different patterns of embossment structures in accordance with a version of the invention.

A portion of the mask work illustrating the different patterns of embossments in this example is shown in FIG. 13.

The Alumina base, in this case, is of the order of 8 mm thick, having a top surface SiC coating of between 2.5 microns and 3 microns in thickness, and a bottom coating of SiC that was about 1.5 microns thick. The epoxy based polymer embossments were between 35 and 45 microns tall prior to lapping.

Example 3

This example shows the interferogram (FIG. 14) of a metal barrier layer coated base substrate. The SiC coated base substrate has a substantially dome shape. The alumina base substrate had a 3 micron SiC metal barrier layer coating on the top facing side (coated side). The interferogram shows that this coated base substrate has peak to valley measurement of 4.48 microns as measured across the chuck and through one of the lift pins. The image shows the location of the three lift pin holes.

Example 4

This example illustrates a vacuum chuck that is substantially flat or slightly concave that was made by lapping polymeric embossments on a surface of the base substrate to a flatness where the tops of the polymeric embossments are characterized in that a prime silicon wafer clamped by the vacuum chuck has a flatness as measured by interferometry with a peak to valley variation of 1 microns or less across portions of the substrate when the prime wafer is clamped by the vacuum chuck at a pressure of 150 torr between the chuck and the backside of the substrate.

The embossments were made from epoxy based polymer that was patterned, developed and cured. The embossments had an adhesion shear strength with the underlying metal barrier layer which allowed the patterned polymeric embossments to be lapped with a diamond polishing pad and aqueous lubricating liquid under the chuck's own weight to their final height without tearing or damage to the patterned embossments from the underlying lapping pad surface during the lapping process.

The chuck was characterized using a prime wafer clamped to the embossments at a pressure of 150 torr (absolute vacuum). The surface of the clamped wafer was analyzed using interferometry using the following setup. A test fixture was used to hang the chuck and vacuum clamped wafer in front of the interferometer. The test fixture was hung on a goniometer in front of the interferometer's transmission flat during measurement (the goniometer has alignment knobs that allow more precise alignment of the chucked wafer surface with the transmission flat). Brackets were used to position the fixture in the interferometer. The wavelength of the source was 632 nm.

Figure 15:
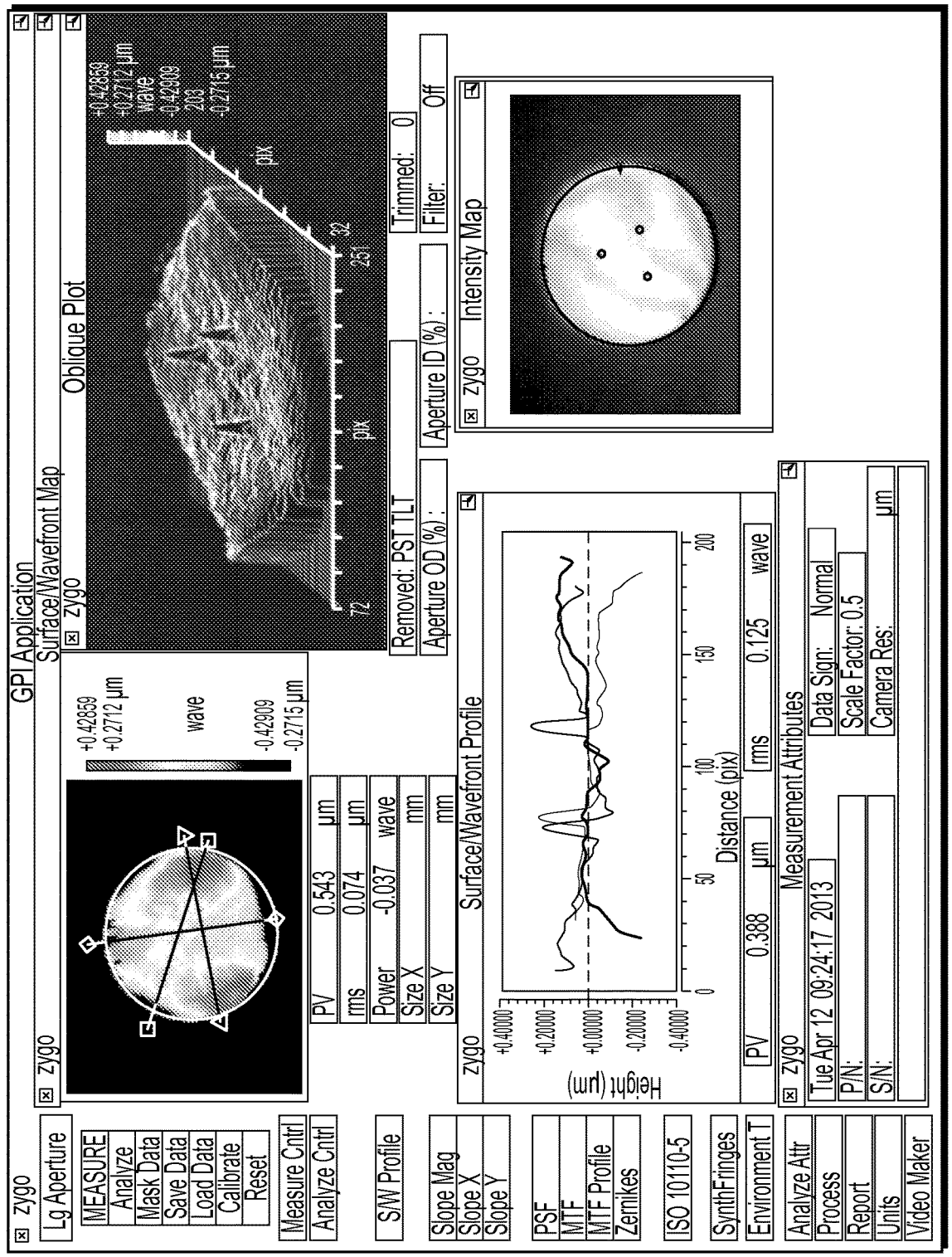

FIG. 15 illustrates the substrate flatness as measured peak to valley across the lapped chuck substrate using the clamped wafer. In this example the peak to valley height measurement across the diameter of the chuck is 0.54 microns. The lift pins are visible near the center of the interferogram. As illustrated by the color shading which indicates relatively high and low points, the lapped chuck substrate has a substantially flat top surface as indicated by the clamped wafer.

Figure 16:
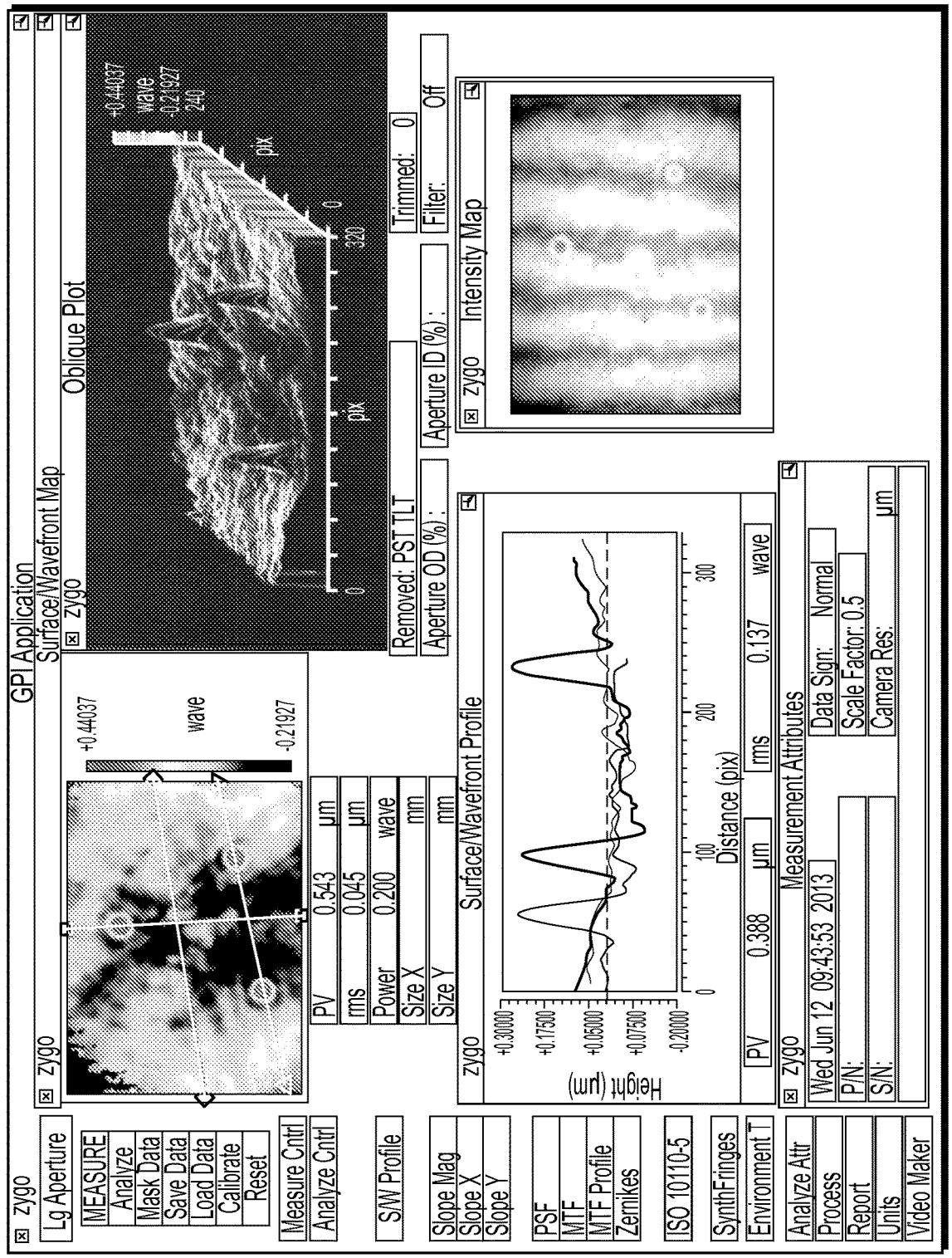

FIG. 16 shows the interferogram of the center region of the lapped chuck substrate of this example (using a clamped wafer) in more detail. The peak to valley height measurement in this region is about 0.42 microns.

Figure 17:
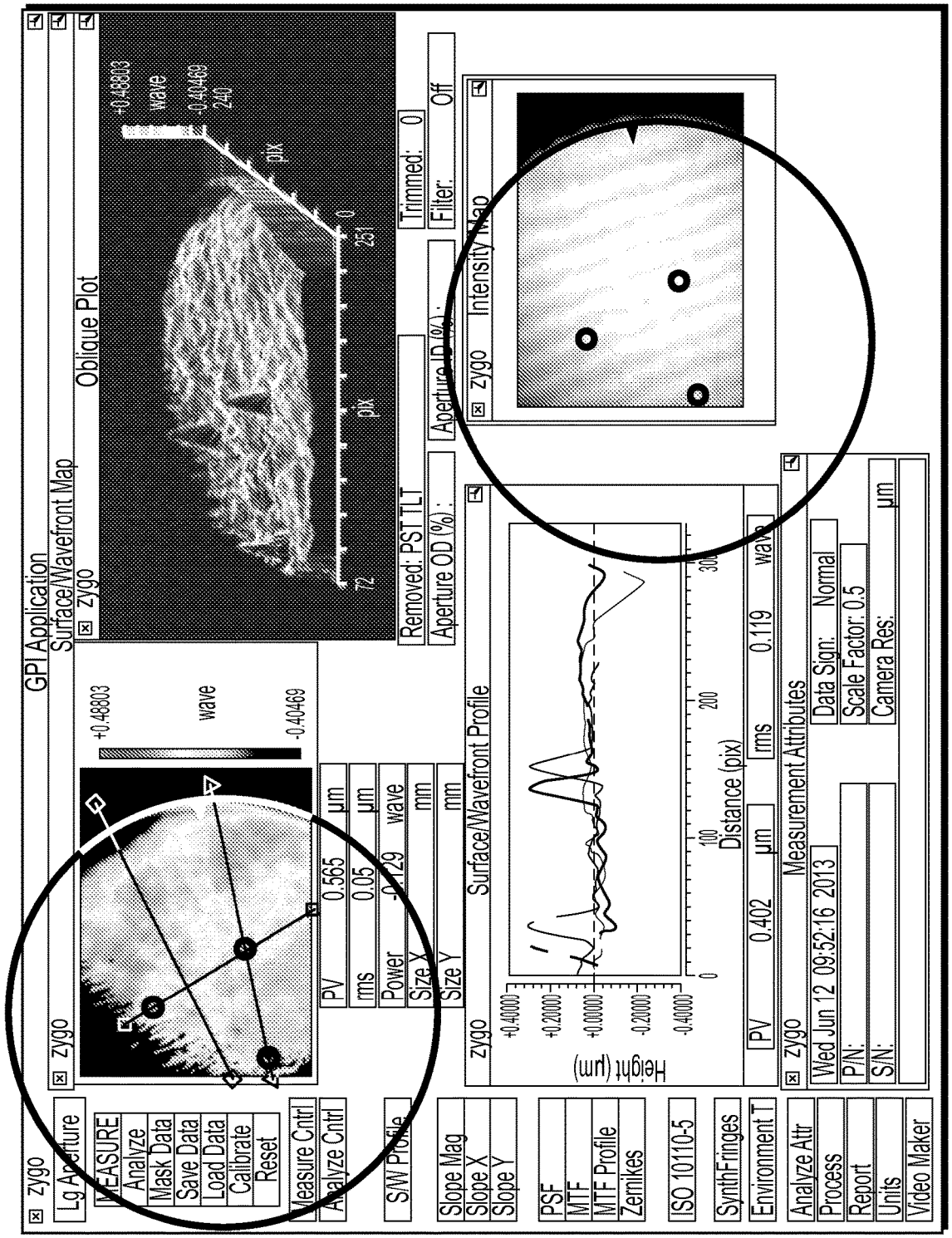

FIG. 17 shows the interferogram of the edge region of the lapped chuck substrate of this example (using a clamped wafer) in more detail. The peak to valley height measurement in this region is about 0.56 microns.

The results of this example illustrate a clamping chuck with polymeric embossments that has a flatness across its wafer clamping surface of between 1 micron and 0.5 microns. In some localized regions of the chuck, the flatness is between 0.4 microns and 0.5 microns.

Although the present invention has been described in considerable detail with reference to certain embodiments thereof, other versions are possible. Vacuum chucks disclosed herein may be used for other substrate bonding applications such as SOI (silicon on insulator), or wafer stacking. The shape of the vacuum chuck may be modified for different shaped substrates as well as different size substrates. For example, wafer substrates may include but are not limited to 200 millimeter diameter, 300 millimeter diameter, or 450 millimeter diameter wafers. The vacuum chuck may be used to chuck (hold) substrates that include geometric shapes or irregular shapes. Therefore the spirit and scope of the appended claims should not be limited to the description and the versions contain within this specification.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A method of refurbishing a vacuum chuck, the method comprising:
   removing at least one pre-existing structure comprising a polymer from atop a surface of a base substrate of the vacuum chuck, the base substrate of the vacuum chuck having one or more vacuum ports;
   forming a clean surface on the base substrate, the clean surface comprising a first peak to valley flatness; and
   forming at least one new embossment structure comprising a polymer atop the clean surface of the base substrate, the at least one new embossment structure extending to a height above portions of the base substrate surrounding the at least one new embossment structure to support a prime wafer upon the at least one new embossment structure during vacuum chucking of the prime wafer;
   the height of the at least one new embossment structure being such that the prime wafer clamped by the vacuum chuck against the at least one new embossment structure has a second peak to valley flatness that is less than the first peak to valley flatness; and
   wherein the at least one new embossment structure comprises a plurality of new embossment structures that vary in at least one of shape or pattern over a plurality of different regions of the base substrate surface, the plurality of different regions of the base substrate surface comprising at least one region around at least one of a lift pin hole of the vacuum chuck and a gas seal of the vacuum chuck.

2. The method of claim 1 wherein an adhesion shear strength of the polymer of the at least one new embossment structure with the clean surface of the base substrate is greater than 20 megapascals.

3. The method of claim 1, wherein the polymer of the at least one embossment structure has a Young's Modulus of between about 1.5 and 3.5 GPa, and a tensile strength of between about 70 and 120 MPa.

4. The method of claim 1, wherein the at least one embossment structure comprises a plurality of embossment structures arranged in a trigonal pattern.

5. The method of claim 1, wherein the base substrate further comprises at least one metal barrier layer.

6. The method of claim 1, wherein the second peak to valley flatness is a flatness as measured by interferometry with a peak to valley variation of 5 microns or less across at least a portion of the prime wafer when the prime wafer is clamped by the vacuum chuck at a pressure delta of between 50 torr and 750 torr between the vacuum chuck and the backside of the prime wafer.

7. The method of claim 1, wherein the second peak to valley flatness is a flatness as measured by interferometry with a peak to valley variation of 2.5 microns or less across at least a portion of the prime wafer when the prime wafer is clamped by the vacuum chuck at a pressure delta of between 50 torr and 750 torr between the vacuum chuck and the backside of the prime wafer.

8. The method of claim 1, wherein the second peak to valley flatness is a flatness as measured by interferometry with a peak to valley variation of 1.5 microns or less across at least a portion of the prime wafer when the prime wafer is clamped by the vacuum chuck at a pressure delta of between 50 torr and 750 torr between the vacuum chuck and the backside of the prime wafer.

9. The method of claim 1, wherein the at least one embossment structure comprises a polymeric overcoat over the base substrate and an underlying embossment base.

* * * * *